(12) United States Patent
Miao et al.

(10) Patent No.: US 10,506,716 B2
(45) Date of Patent: Dec. 10, 2019

(54) TUBULAR LIGHTING DEVICE ASSEMBLY

(71) Applicant: SIGNIFY HOLDING B.V., Eindhoven (NL)

(72) Inventors: Chris Wh Miao, Shanghai (CN); Rong Hong Xu, Shanghai (CN); Hongwu Wang, Shanghai (CN); Jinsong Tong, Shanghai (CN)

(73) Assignee: SIGNIFY HOLDING B.V., Eindhoven (NL)

( * ) Notice: Subject to any disclaimer, the term of this patent is extended or adjusted under 35 U.S.C. 154(b) by 205 days.

(21) Appl. No.: 15/492,104

(22) Filed: Apr. 20, 2017

(65) Prior Publication Data

US 2017/0318678 A1 Nov. 2, 2017

(30) Foreign Application Priority Data

Apr. 28, 2016 (WO) ................ PCT/CN2016/080483
May 17, 2016 (EP) ..................................... 16169825

(51) Int. Cl.
*H05K 1/18* (2006.01)
*F21V 3/02* (2006.01)
(Continued)

(52) U.S. Cl.
CPC ............. *H05K 1/181* (2013.01); *F21K 99/00* (2013.01); *F21V 3/02* (2013.01); *F21V 23/00* (2013.01);
(Continued)

(58) Field of Classification Search
CPC .......... H05K 1/181; H05K 1/111; H05K 3/34; H05K 2201/10106; F21K 99/00;
(Continued)

(56) References Cited

U.S. PATENT DOCUMENTS 5,418,691 A 5/1995 Tokura
5,920,465 A 7/1999 Tanaka
(Continued)

FOREIGN PATENT DOCUMENTS

GB 2531425 A 4/2016

*Primary Examiner* — Bao Q Truong
(74) *Attorney, Agent, or Firm* — Daniel J. Piotrowski

(57) ABSTRACT

A tubular solid state lighting device is disclosed having a light transmissive tube. A flexible carrier strip having a first portion attached to an inner wall section of the tube, and comprises an elongate major surface and a further elongate major surface opposite the elongate major surface. The elongate major surface carries a plurality of solid state lighting elements on the first portion and a plurality of electrically conductive contacts on adjacent terminal regions separated by a recess at one end. The flexible carrier strip is soldered to a rigid printed circuit board comprising a first major surface onto which a driver circuit for the solid state lighting elements is mounted facing the flexible carrier strip and a second major surface opposite the first major surface carrying a plurality of spatially separated soldering pads along an edge of the second major surface. The further elongate major surface contacts the second major surface such that each electrically conductive contact is aligned with one of the spatially separated soldering pads and is soldered to said soldering pad by a solder portion extending over the terminal region carrying said electrically conductive contact. A method of forming such an assembly and an assembly method for a tubular lighting device are also disclosed.

14 Claims, 7 Drawing Sheets

(51) Int. Cl.
*F21V 23/00* (2015.01)
*F21V 23/06* (2006.01)
*H05K 1/11* (2006.01)
*H05K 3/34* (2006.01)
*F21K 99/00* (2016.01)
*F21Y 103/10* (2016.01)
*F21Y 115/10* (2016.01)

(52) U.S. Cl.
CPC ............ *F21V 23/005* (2013.01); *F21V 23/06* (2013.01); *H05K 1/111* (2013.01); *H05K 3/34* (2013.01); *F21Y 2103/10* (2016.08); *F21Y 2115/10* (2016.08); *H05K 2201/10106* (2013.01)

(58) Field of Classification Search
CPC .......... F21V 3/02; F21V 23/00; F21V 23/005; F21V 23/06; F21Y 2103/10; F21Y 2115/10
USPC ..................................................... 362/217.02
See application file for complete search history.

(56) References Cited

U.S. PATENT DOCUMENTS

| | | | |
|---|---|---|---|
| 8,662,728 B2 | 3/2014 | Chiu et al. | |
| 8,851,356 B1 | 10/2014 | Holec et al. | |
| 2014/0265809 A1* | 9/2014 | Hussell | H05K 1/00 313/3 |
| 2016/0290598 A1* | 10/2016 | Jiang | F21V 7/22 |

\* cited by examiner

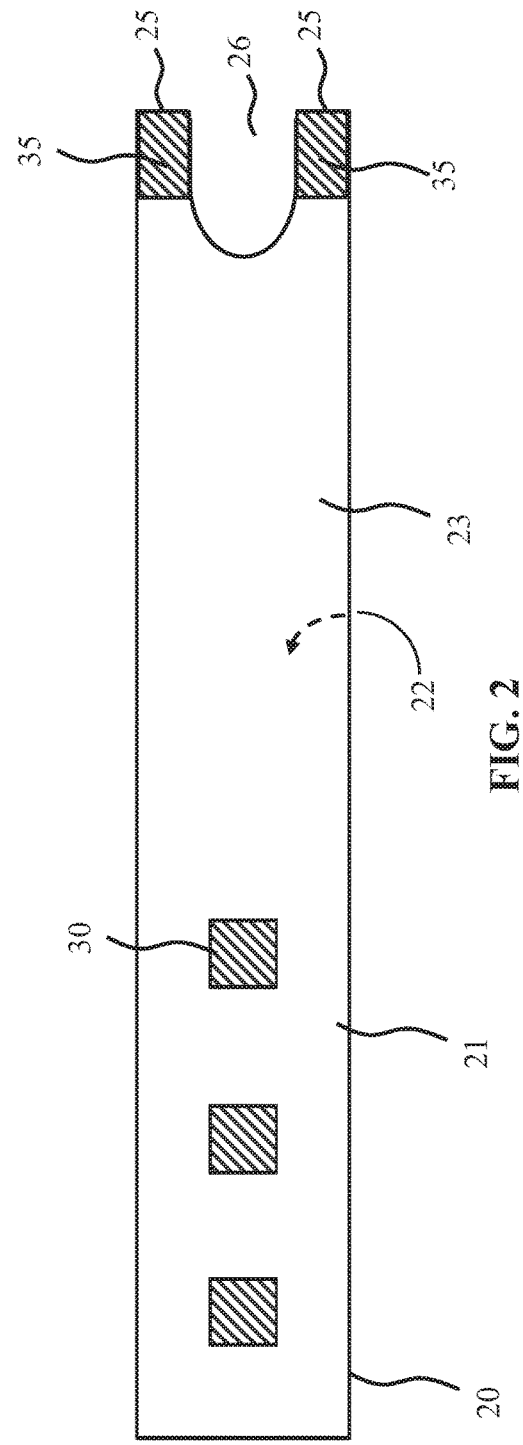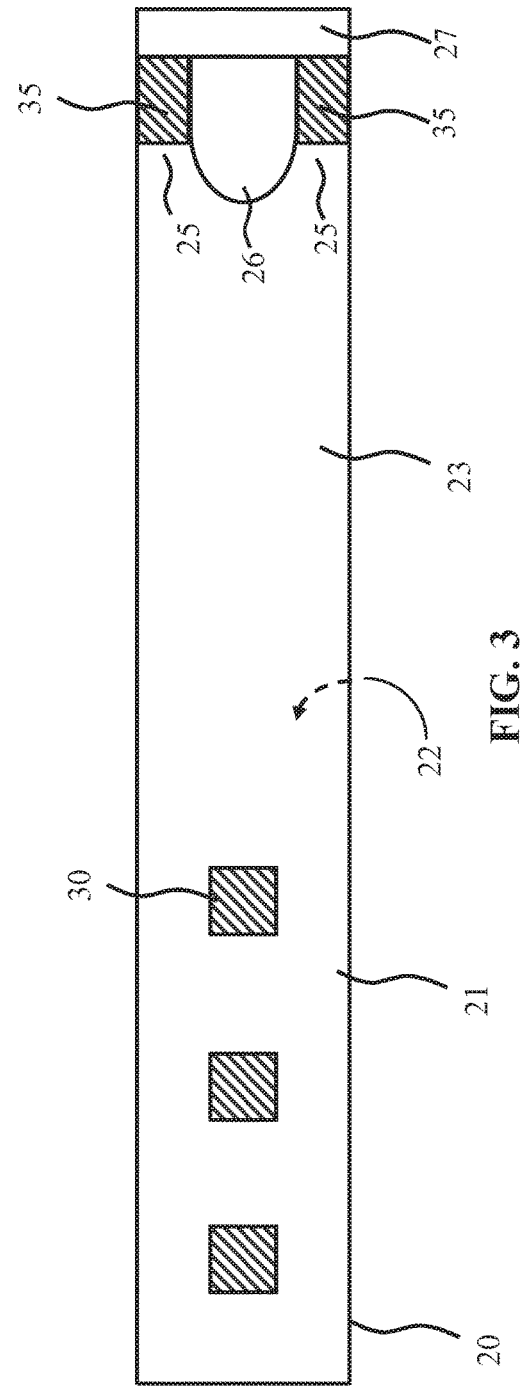

TUBULAR LIGHTING DEVICE ASSEMBLY

FIELD OF THE INVENTION

The present invention relates to a tubular solid state lighting device comprising a light transmissive tube comprising an inner wall section axially extending along the tube; a flexible carrier strip having a first portion attached to said inner wall section, the flexible carrier strip comprising an elongate major surface and a further elongate major surface opposite the elongate major surface, the elongate major surface carrying a plurality of solid state lighting elements on the first portion and a rigid printed circuit board comprising a first major surface onto which a driver circuit for the solid state lighting elements is mounted, said first major surface facing the flexible carrier strip.

The present invention further relates to a method of forming a light engine assembly by soldering such a flexible carrier strip to the rigid printed circuit board.

The present invention further relates to an assembling method of such a lighting device using a thus formed light engine assembly.

BACKGROUND OF THE INVENTION

Solid state lighting such as LED lighting is rapidly gaining popularity due to the green credentials of such lighting. Typically, solid state lighting devices produce their luminous outputs at a fraction of the energy consumption of incandescent or halogen lighting devices. In addition, solid state lighting devices have superior lifetimes compared to incandescent and halogen lighting devices.

In order to generate a luminous output of sufficient intensity, a solid state lighting device typically comprises a plurality of solid state lighting elements, which may be arranged in a regular pattern in other to obtain a homogeneous luminous output. For example, the solid state lighting device may be provided as strip lighting in which a plurality of solid state lighting elements, e.g. LEDs, are mounted on an elongate, e.g. a rectangular, strip such as a flexible carrier strip. Such flexible strips are sometimes referred to as flexible printed circuit boards.

An example of such a lighting device is schematically depicted in FIG. 1, which depicts a tubular solid state lighting device 10 in which a portion of the major surface 22 of the flexible carrier strip 20 is attached to an inner wall section of the tube 12 that axially extends along the tube 12, i.e. the flexible carrier strip 20 is secured along a length direction of the tube 12. This is typically achieved using an adhesive such as glue or a double-sided tape. The flexible carrier strip 20 further comprises a major surface 21 having a region in which solid state lighting elements 30 are arranged to emit light into the tube 12. The tubular solid state lighting device 10 further comprises a rigid printed circuit board (PCB) 40, which may be mounted in an end cap 11 of the tubular solid state lighting device 10 and which typically has a driver circuit 50 mounted on a major surface 42 facing the major surface 21 of the flexible carrier strip. The flexible carrier strip 20 typically comprises an end portion 24 having one or more solder contacts on the major surface 21, which are soldered to corresponding solder contacts on the major surface 42 of the PCB 40.

A typical assembly process of such a tubular solid state lighting device 10 involves the securing of the flexible carrier strip 20 inside the tube 12 such that part of the flexible carrier strip 20 including the end portion 24 sticks out of the tube 12. The rigid PCB 40 is subsequently soldered to the flexible carrier strip 20 after which the rigid PCB 40 is inserted into the tube 12 as indicated by the block arrow, e.g. by capping the tube 12 with the end cap 11. During this process, an intermediate portion 23 of the flexible carrier strip 20 is pushed inwardly to form a meandering region between the first portion of the flexible carrier strip 20 onto which the solid state lighting elements 30 are mounted and the end portion 24 such that the flexible carrier strip 20 folds back on itself.

However, this assembly process suffers from a high failure rate. Specifically, the solder joints between the flexible carrier strip 20 and the rigid PCB 40 are prone to failure due to the fact that the insertion of the rigid PCB 40 into the tube 12 causes these solder joints to be subjected to sheer or peel-off stress associated with pushing the intermediate portion 23 of the flexible carrier strip into the tube 12. Such a failure rate may be reduced by reinforcing the solder joints, e.g. using a double-sided adhesive tape or glue, by more prolonged soldering using additional solder or by inspection of the solder joint, e.g. using x-ray inspection.

U.S. Pat. No. 5,920,465 discloses a connecting structure for interconnection of a flexible printed circuit board (FPC) and a hard printed circuit board (PCB) allowing the FPC and the PCB to be easily connected to each other at a predetermined relative position by fitting a male joint of the FPC into a female joint of the PCB even when a supporting member, such as a casing, is not available immediately below portions of the PCB and FPC to be connected to each other. In the connecting structure for interconnection of an FPC and a PCB, a surface of the FPC opposed to the PCB is provided with a male joint in the form of a protruding plate, and a surface of the PCB opposed to the FPC is provided with a female joint in the form of an opening or a recess adapted to receive the protruding plate and thereby to position the FPC at a predetermined location of the PCB.

These measures all have in common that the improved robustness of the connection between the flexible carrier strip and the rigid PCB increase the complexity and/or manufacturing cost of the tubular solid state lighting device 10. This is undesirable, for example because the additional cost of solid state lighting devices compared to traditional incandescent, halogen or fluorescent lighting devices is one of the main obstacles on the road to large-scale replacement of such traditional lighting devices with the more energy-efficient solid state lighting equivalents.

SUMMARY OF THE INVENTION

The present invention seeks to provide a more cost-effective tubular solid state lighting device that exhibits improved robustness of the solder connections between the flexible carrier strip and the rigid PCB.

The present invention further seeks to provide a cost-effective method of forming a light engine assembly by soldering a flexible carrier strip to a rigid printed circuit board that improves the robustness of the solder connections between the flexible carrier strip and the rigid PCB during insertion of such a light engine assembly into the tube of a tubular solid state lighting device.

The present invention further seeks to provide an assembly method of such a tubular solid state lighting device in which the insertion of such a light engine assembly is achieved with a reduced failure rate.

According to an aspect, there is provided a tubular solid state lighting device comprising a light transmissive tube comprising an inner wall section axially extending along the tube; a flexible carrier strip having a first portion attached to said inner wall section, the flexible carrier strip comprising an elongate major surface and a further elongate major surface opposite the elongate major surface, the elongate major surface carrying a plurality of solid state lighting elements on the first portion, and carrying a plurality of electrically conductive contacts each acting as a terminal for the plurality of solid state lighting elements in adjacent terminal regions at one end of the flexible carrier strip, said adjacent terminal regions being separated by a recess; and a rigid printed circuit board comprising a first major surface onto which a driver circuit for the solid state lighting elements is mounted, said first major surface facing the flexible carrier strip; and a second major surface opposite the first major surface carrying a plurality of spatially separated soldering pads along an edge of the second major surface, each soldering pad corresponding to one electrically conductive contact; wherein the further elongate major surface contacts the second major surface such that each electrically conductive contact is aligned with one of the spatially separated soldering pads and is soldered to said soldering pad by a solder portion extending over the terminal region carrying said electrically conductive contact.

The provision of such a solder contact between the flexible carrier strip and the rigid PCB on the second major surface of the rigid PCB ensures that the solder contact is exposed to a reduced tear off stress upon insertion of the rigid PCB into the tube of the tubular solid state lighting device, due to the fact that the leading edge of the rigid PCB pushes the intermediate region of the flexible carrier strip into the tube, thereby alleviating the forces on the solder joints between the flexible carrier strip and the rigid PCB. Moreover, because the solder portions extend over the terminal regions of the flexible carrier strip, a stronger bonding of the terminal regions to the rigid PCB is achieved.

The flexible carrier strip may further comprise a meandering intermediate region in between the first portion and the adjacent terminal regions.

Preferably, each of the soldering pads is wider than the corresponding electrically conductive contact in a direction along the edge. This facilitates securing of the terminal regions of the flexible carrier strip onto the solder pads of the rigid PCB in a straightforward manner.

The flexible carrier strip may comprise an electrically insulating layer on the further elongate major surface in between the flexible carrier strip and the inner wall section. Such electrical insulation reduces the risk of electrical shock upon a person touching the tube of the tubular solid state lighting device whilst the device is connected to a power supply, e.g. a mains power supply.

The flexible carrier strip may further comprise an enhancing portion bridging parallel edges of the adjacent terminal regions. Such an enhancing portion may assist in establishing an intimate contact between the flexible carrier strip and the rigid PCB, i.e. may assist in flattening the flexible carrier strip against the rigid PCB.

The electrically conductive contacts may be copper contacts although other suitable electrically conductive materials suitable for use in a solder process may also be contemplated The solder portion may comprise tin although other suitable solder materials suitable for use in a solder process may also be contemplated.

The plurality of electrically conductive contacts may be a pair of electrically conductive contacts and the plurality of spatially separated soldering pads may be a pair of soldering pads although larger numbers of electrically conductive contacts and/or spatially separated soldering pads may also be contemplated.

The rigid PCB may be secured in an end cap of the tubular solid state lighting device, which is a cost-effective way of mounting the rigid PCB within the tubular solid state lighting device.

In at least some embodiments, the solid state lighting elements are LEDs.

According to another aspect, there is provided a method of forming a light engine assembly by soldering a flexible carrier strip to a rigid printed circuit board, comprising providing a flexible carrier strip comprising an elongate major surface and a further elongate major surface opposite the elongate major surface, the elongate major surface carrying a plurality of solid state lighting elements on a first portion of the flexible carrier strip, and carrying a plurality of electrically conductive contacts each acting as a terminal for the plurality of solid state lighting elements in adjacent terminal regions at one end of the flexible carrier strip, said adjacent terminal regions being separated by a recess; providing a rigid printed circuit board comprising a first major surface onto which a driver circuit for the solid state lighting elements is mounted, and a second major surface opposite the first major surface carrying a plurality of spatially separated soldering pads along an edge of the second major surface, each soldering pad corresponding to one electrically conductive contact; aligning the flexible carrier strip with the rigid printed circuit board such that the further elongate major surface contacts the second major surface and each electrically conductive contact is aligned with one of the spatially separated soldering pads; and soldering each electrically conductive contact to the aligned soldering pad by applying a solder portion to the electrically conductive contact and extending said solder portion over the terminal region carrying said electrically conductive contact onto the aligned soldering pad. A light engine assembly formed in accordance with this method exhibits improved robustness against failure of the solder portions when inserted into a tube of a tubular solid state lighting device without significantly increasing the cost of the light engine assembly.

Preferably, each of the soldering pads is wider than the corresponding electrically conductive contacts in a direction along the edge. In this configuration, the solder portions may be formed in a particularly straightforward manner by spilling the solder portions of the edges of the adjacent terminal regions that face the recess in between these regions.

Soldering each electrically conductive contact to the aligned soldering pad by applying a solder portion to the electrically conductive contact and extending said solder portion over the terminal region carrying said electrically conductive contact onto the aligned soldering pad may be performed with a soldering iron.

Soldering each electrically conductive contact to the aligned soldering pad by applying a solder portion to the electrically conductive contact and extending said solder portion over the terminal region carrying said electrically conductive contact onto the aligned soldering pad may comprise applying a solder portion containing tin.

According to yet another aspect, there is provided an assembling method of a lighting device including a light transmissive tube comprising an inner wall section axially extending along the tube and the light engine assembly formed by the method according to one or more of the embodiments of the present invention, the assembling method comprising securing the first portion of the flexible carrier strip into the tubular body such that the elongate major surface faces a central axis of the tubular body; and inserting the printed circuit board through an opening in said tubular body, thereby causing an intermediate region of the flexible carrier strip in between the first portion and the adjacent terminal regions to meander. The use of the light engine assembly manufactured in accordance with embodiments of the present invention ensure state during this insertion process of the rigid PCB of the light engine assembly into the tube of the tubular solid state lighting device, a lower failure rate is achieved compared to the prior art. It is noted for the avoidance of doubt that the method of forming the light engine assembly may be performed after the first portion of the flexible carrier strip is secured into the tubular body, i.e. by soldering the rigid PCB to the terminal portion of the flexible carrier strip sticking out of the tube in accordance with the method of forming the light engine assembly prior to inserting the rigid PCB into the tube.

Preferably, inserting the printed circuit board through the opening in said tubular body comprises securing the printed circuit board in an end cap for the tubular body and capping said opening with the end cap. In this manner, the rigid PCB may be secured within the tubular solid state lighting device in a particularly cost-effective manner.

BRIEF DESCRIPTION OF THE DRAWINGS

Embodiments of the invention are described in more detail and by way of non-limiting examples with reference to the accompanying drawings, wherein:

FIG. 2 schematically depicts a flexible carrier strip according to an embodiment;

FIG. 3 schematically depicts a flexible carrier strip according to another embodiment;

DETAILED DESCRIPTION OF THE EMBODIMENTS

Figure 1:
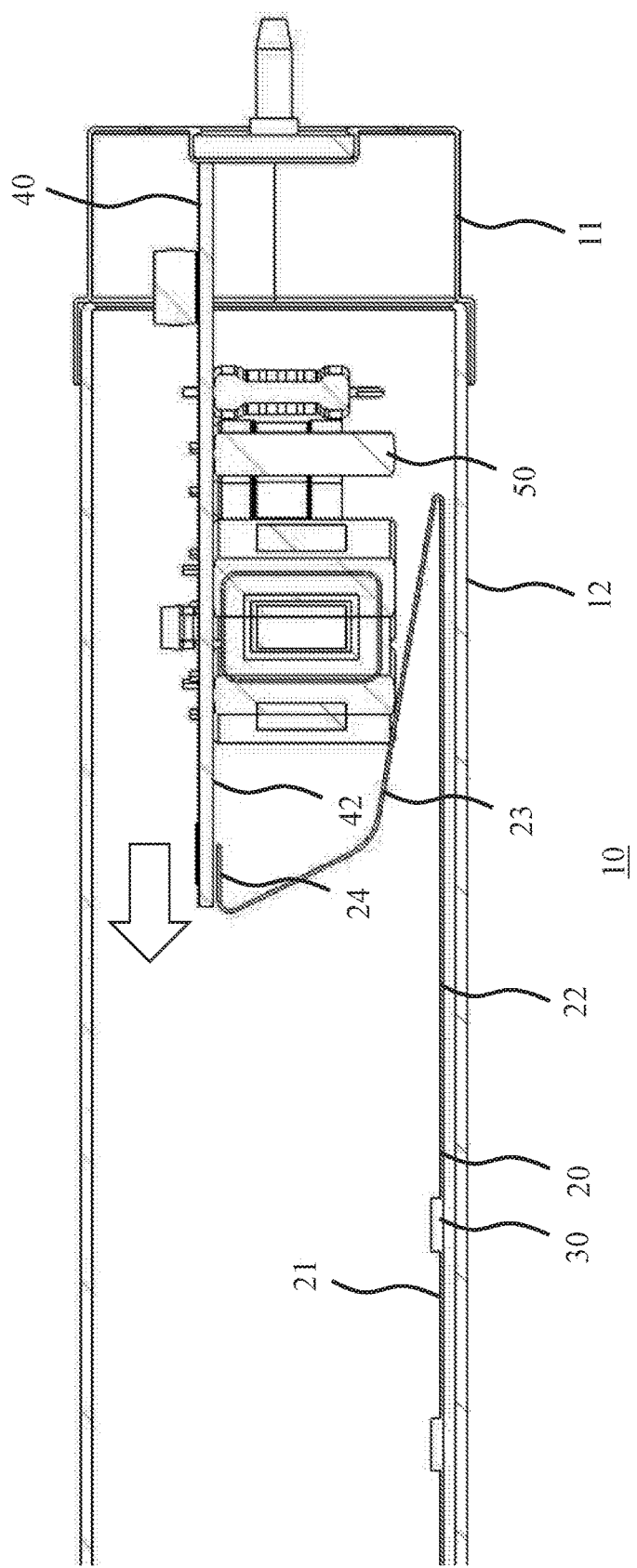
FIG. 1 schematically depicts a prior art tubular solid state lighting device.

It should be understood that the Figures are merely schematic and are not drawn to scale. It should also be understood that the same reference numerals are used throughout the Figures to indicate the same or similar parts.

FIG. 2 schematically depicts a top view of a flexible carrier strip 20 according to an embodiment. The flexible carrier strip 20 comprises an elongate major surface 21 and an opposing elongate major surface 22. The elongate major surface 21 carries a plurality of solid state lighting (SSL) elements 30 in a first region of the flexible carrier strip 20. Such SSL elements 30 for example may be LEDs, which may be individually addressable or addressable as a group. The SSL elements 30 may comprise identical LEDs, e.g. white light LEDs, or LEDs that may be configured to produce light of different colours. In the case of individually addressable LEDs, such different colour LEDs may be used to generate light having a configurable colour or colour temperature, e.g. white light having different colour temperatures.

The flexible carrier strip 20 further comprises an intermediate region 23 in between the region at which the SSL elements 30 are mounted and an end region comprising a pair of the terminal regions 25 separated by a recess 26. The terminal regions 25 may be considered terminal fingers extending from the main body of the flexible carrier strip 20. Each terminal region 25 carries at least one electrically conductive contact 35 on the elongate major surface 21. In some embodiments, each terminal region 25 may carry a plurality of such electrically conductive contacts 35. The electrically conductive contacts 35 may be made of any electrically conductive material, e.g. metal or metal alloy, to which a solder may be adhered as will be explained in more detail below. By way of non-limiting example, the electrically conductive contacts 35 may be copper or copper alloy contacts.

Although not explicitly shown, conductive tracks may be embedded or otherwise deployed in the flexible carrier strip 20, which conductive tracks provide electrical connections between the electrically conductive contacts 35 and respective SSL elements 30. This is well-known per se and will not be explained in further detail for the sake of brevity. The conductive tracks may be made of any suitable material, e.g. a metal or metal alloy, which may be the same metal or metal alloy is used for the electrically conductive contacts 35 although this is not strictly necessary.

The further elongate major surface 22 may carry an electrically insulating layer, e.g. an electrically insulating film such as polyimide or the like, such that when the further elongate major surface 22 is secured against a receiving surface, e.g. an inner wall section of tube of a tubular solid state lighting device that axially extends along the tube shields the tube from being exposed to the electrical currents running from the electrically conductive contacts 35 through the conductive tracks to the SSL elements 30, thereby reducing the risk of someone touching the tube from suffering an electrical shock. The flexible carrier strip 20 may be made of any suitable material or stack of materials. By way of non-limiting example, the flexible carrier strip 20 may comprise a layer stack including an electrically insulating film such as polyimide or the like onto which a (patterned) metal or metal alloy layer is adhered, e.g. a copper layer or the like, which (patterned) metal or metal alloy layer may be covered by an electrically insulating further layer that is patterned to expose the electrically conductive contacts 35, e.g. soldering pads, of the flexible carrier strip 20. Other suitable embodiments of such flexible PCBs will be immediately apparent to the skilled person.

FIG. 3 schematically depicts a top view of a flexible carrier strip 20 according to another embodiment in which the parallel edges of the terminal regions 25 distal to the main body of the flexible carrier strip 20 are fused by an enhancing portion 27 that acts as a bridging portion between the two terminal regions 25 and the recess 26 in between these two terminal regions. As will be explained in more detail below, such an enhancing portion 27 may assist in promoting the flatness of the and terminals 25 against a rigid PCB onto which the flexible carrier strip 20 is to be secured by soldering. For the avoidance of doubt, it is noted that such an enhancing portion 27 may simply be formed by providing a continuous flexible carrier strip 20 and creating the recess 26 in the flexible carrier strip 20, e.g. by cutting, stamping or the like such that the recess 26 is formed between the enhancing portion 27 and the main body of the flexible carrier strip 20.

Figure 4:
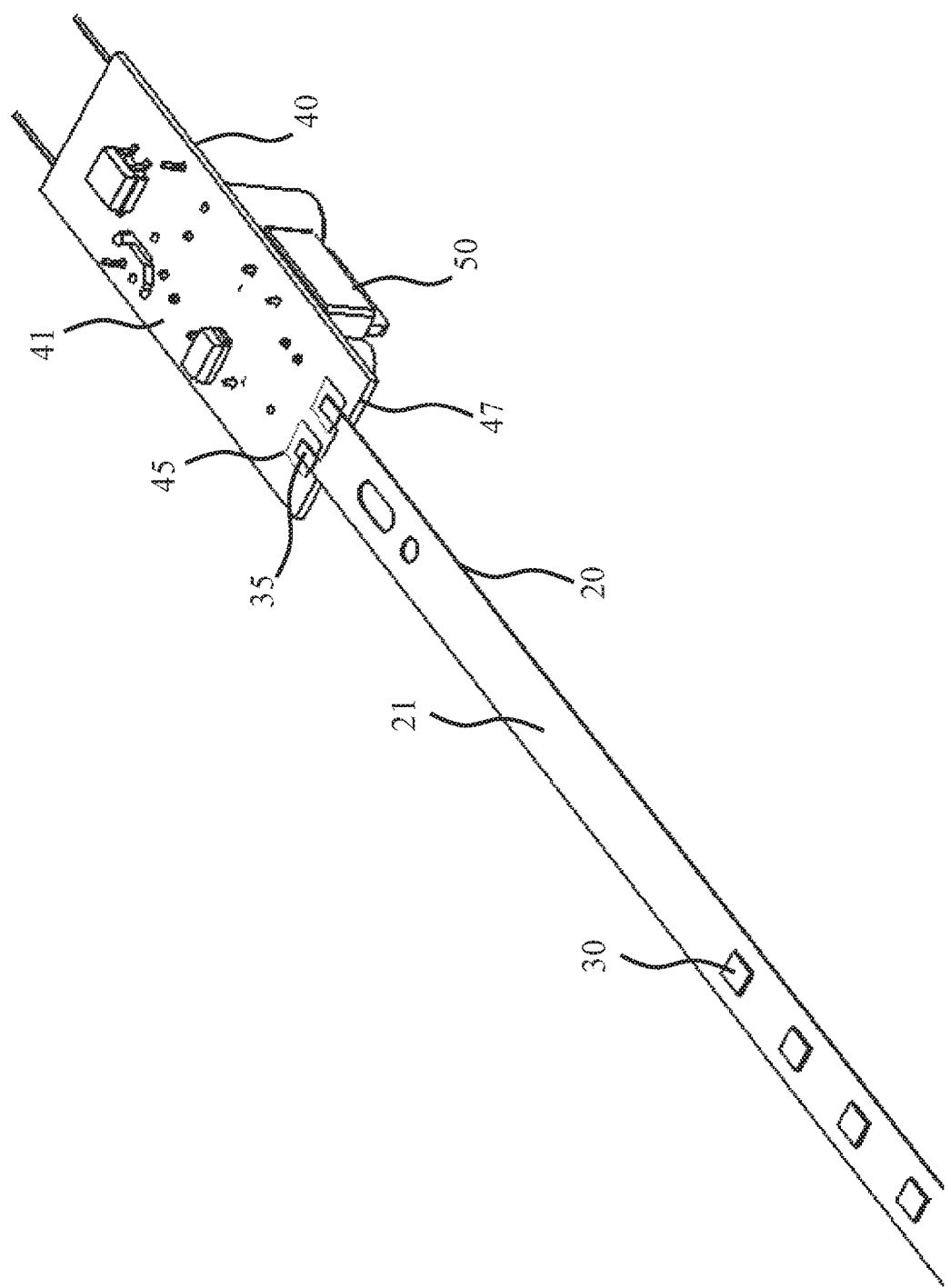
FIG. 4 schematically depicts a step of a method of forming a light engine assembly according to an embodiment in perspective view.

FIG. 4 schematically depicts part of a method of forming a light engine assembly by soldering the flexible carrier strip 20 to a rigid printed circuit board 40 comprising a first major surface 42 onto which a driver circuit 50 for the solid state lighting elements 30 is mounted in any suitable manner, e.g. by soldering pins of the driver circuit 50 extending through the rigid PCB 40 to soldering pads or the like of the rigid PCB. The rigid PCB 40 further comprises a second major surface 41 opposite the first major surface 42, which carries a plurality of spatially separated soldering pads 45 along an edge 47 of the second major surface 41. Each soldering pad 45 corresponds to one of the electrically conductive contacts 35 of the flexible carrier strip 20, i.e. is designed to engage with one of the electrically conductive contacts 35. As schematically shown in FIG. 4, the soldering pads 45 are typically dimensioned to be larger than the electrically conductive contacts 35 such that at least the width, i.e. the dimension along the edge 47, of the soldering pads 45 is larger than the width of a corresponding terminal region 25 of the flexible carrier strip 20. The materials used for the soldering pads 45 are not particularly limited; any suitable electrically conductive material that is compatible with a soldering process may be used for this purpose. Such materials are well-known per se and are therefore not explained in further detail for the sake of brevity.

Figure 5:
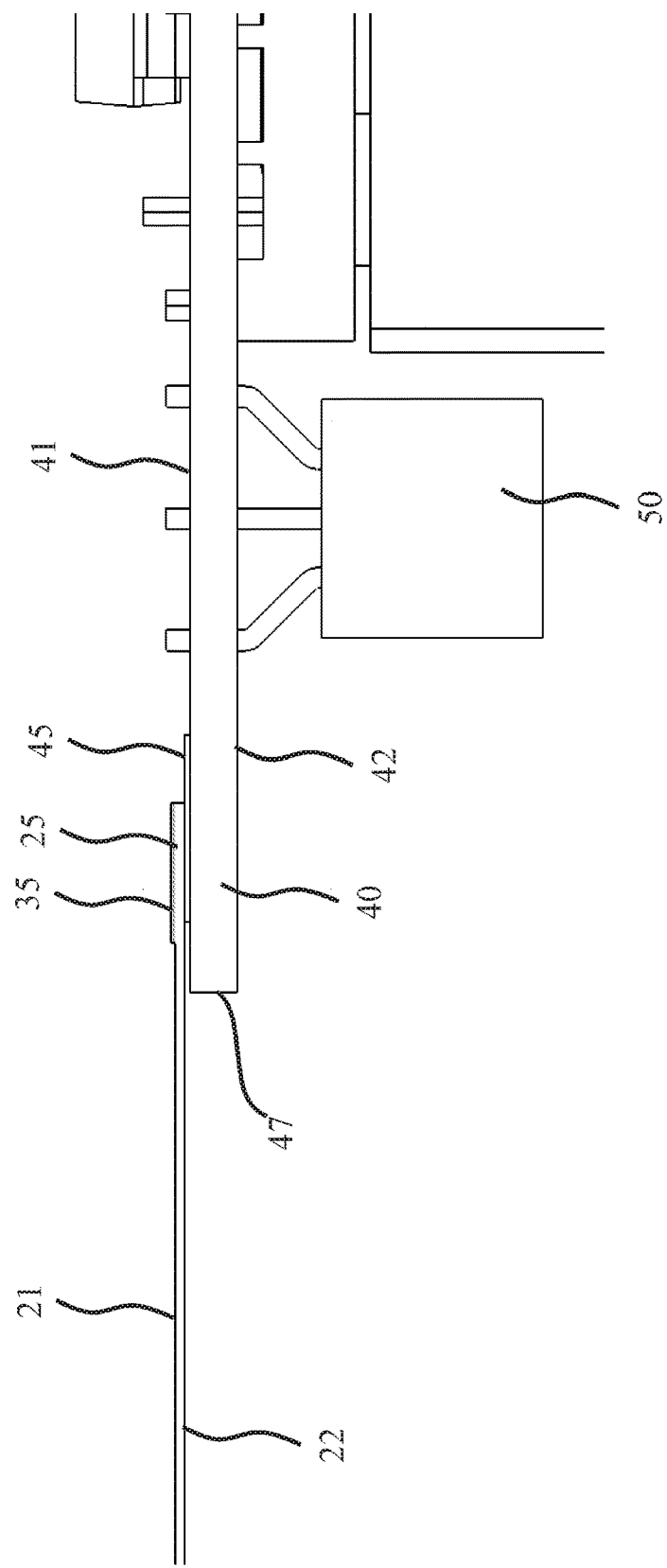
FIG. 5 schematically depicts a side view of the light engine assembly of FIG. 4 in more detail.

As shown in more detail in FIG. 5, the flexible carrier strip 20 is aligned with a rigid PCB 40 such that the further elongate major surface 22 of the flexible carrier strip 20 contacts the second major surface 41 of the rigid PCB 40 and each electrically conductive contact 35 is aligned with one of the spatially separated soldering pads to which the electrically conductive contact 35 is to be soldered. In other words, rather than in conventional soldering arrangements in which the electrically conductive contacts 35 of the flexible carrier strip 20 would face the soldering pads 45 of the rigid PCB 40, in the approach according to embodiments of the present invention, the flexible carrier strip 20 is located in between the electrically conductive contacts 35 and the corresponding soldering pads 45.

Figure 6:
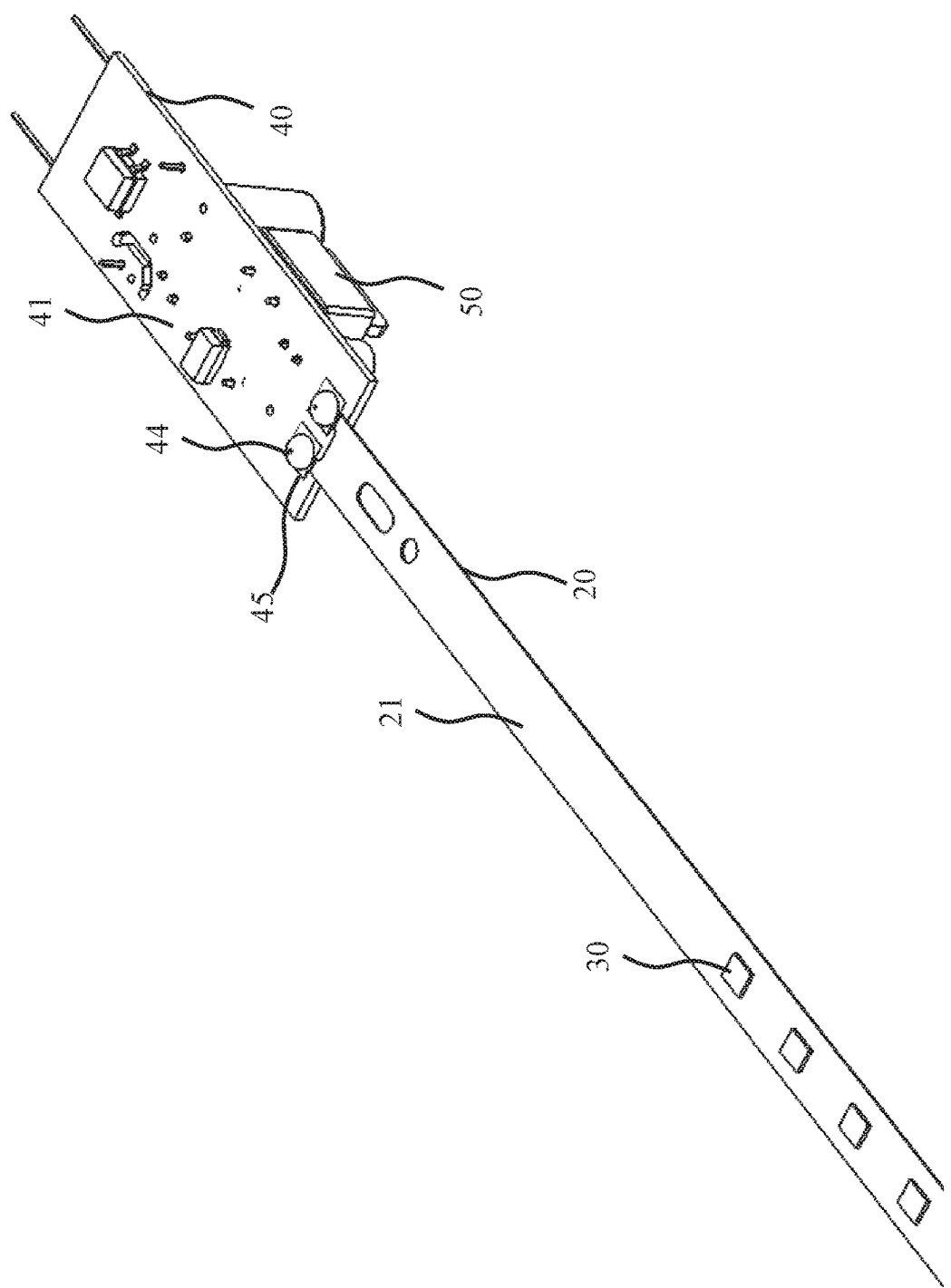
FIG. 6 schematically depicts a further step of a method of forming a light engine assembly according to an embodiment in perspective view.

As schematically depicted in FIG. 6, upon correct alignment of the flexible carrier strip 20 with the rigid PCB 40, solder portions 44 are deposited over the terminal regions 25 including the electrically conductive contacts 35, i.e. the terminal regions 25 are wrapped in the solder, which envelopes the terminal regions 25 and bonds to the underlying soldering pads 45 on the second major surface 41 of the rigid PCB 40. Typically, the solder portions 44 extend into the recess 26 of the flexible carrier strip 20 (and around the other edges of the terminal regions 25) to secure the terminal regions 25 of the flexible carrier strip 20 onto the soldering pads 45 of the rigid PCB 40. This is feasible due to the fact that the soldering pads 45 have larger dimensions, e.g. a larger width along the edge 47 of the rigid PCB 40 then the terminal regions 25 such that part of the soldering pads 45 remain exposed once the terminal regions 25 are correctly positioned over the soldering pads 45, thereby providing exposed surface regions of the soldering pads 45 onto which the soldering portions 44 may be bonded. Any suitable type of solder may be used to form the soldering portions 44. In an embodiment, the solder comprises tin, i.e. is a tin-based solder, which is particularly advantageous if the electrically conductive contacts 35 and/or the soldering pads 45 are made of copper or a copper alloy, as tin-based solders have a favorable affinity with copper and copper alloys. The solder portions 44 may be formed using any suitable soldering technique. For example, so-called hot rod soldering using a soldering iron may be used.

Figure 7:
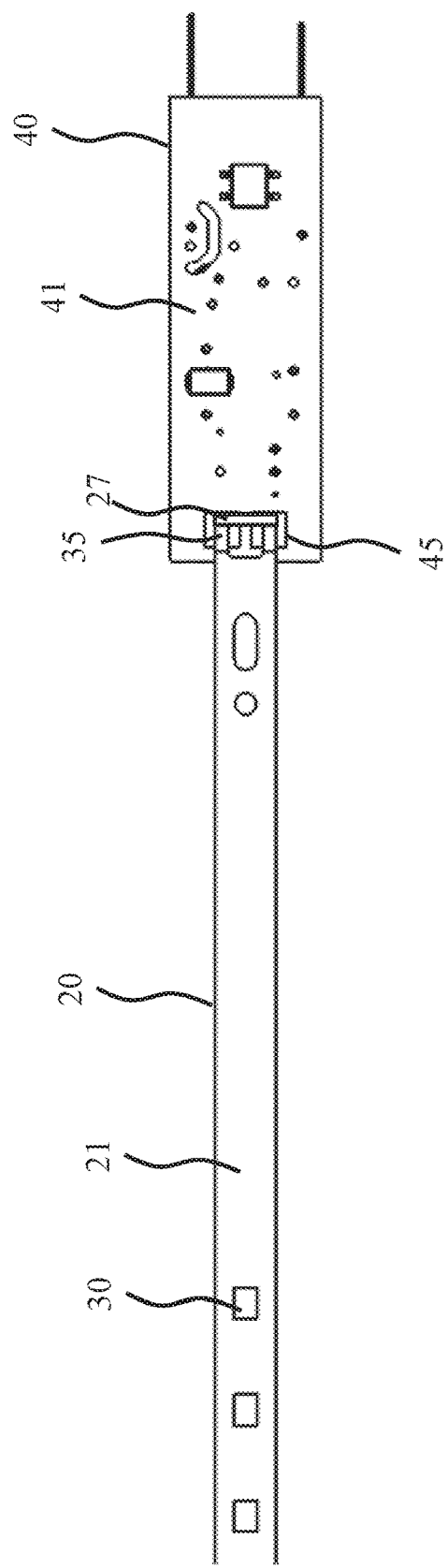
FIG. 7 schematically depicts a step of a method of forming a light engine assembly according to another embodiment in perspective view.

FIG. 7 schematically depicts an aspect of an alternative embodiment of such a method of forming a method of forming a light engine assembly by soldering the flexible carrier strip 20 to a rigid printed circuit board 40. FIG. 7 differs from FIG. 5 in that the flexible carrier strip 20 as schematically depicted in FIG. 2 is replaced with the flexible carrier strip 20 as schematically depicted in FIG. 3. Consequently, the terminal regions 25 of the flexible carrier strip 20 are positioned in between the edge 47 of the rigid PCB 40 and the enhancing portion 27. The enhancing portion 27 prohibits the independent out of plane bending of the respective terminal regions 25 and therefore assists in more easily achieving good planarity of the terminal regions 25 on the rigid PCB 40, e.g. by pressing down the enhancing portion 27, e.g. during soldering of the soldering portions 44 over the terminal regions 25. By pressing down the enhancing portion 27 during soldering, the terminal regions 25 are forced against the second major surface 41 of the rigid PCB 40, which therefore assists in achieving good quality bonding of the terminal portions 25 and the electrically conductive contacts 35 carried by these terminal portions 25 to the underlying soldering pads 45. The flexible carrier strip 20 may be soldered to the rigid printed circuit board 40 as previously explained with the aid of FIG. 6 and its detailed description, such that this will not be explained again for the sake of brevity only.

Figure 8:
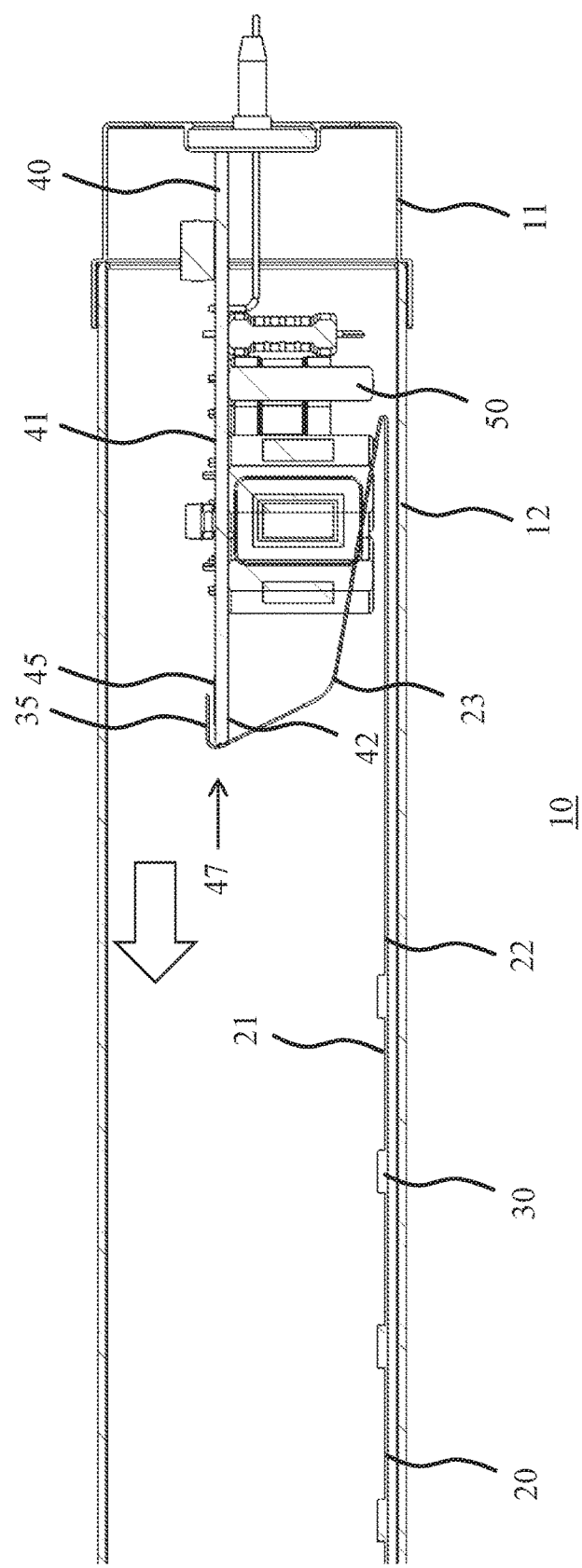
FIG. 8 schematically depicts an assembly method of a tubular solid state lighting device according to an embodiment.

The light engine assemblies that may be made using the above described method may be used in the assembly method of a tubular solid state lighting device 10 as schematically depicted in FIG. 8. Such a tubular solid state lighting device 10 typically comprises a tube 12 of optically transparent or translucent material, e.g. glass or an optical grade polymer such as polycarbonate, PMMA, PET or the like, which tube 12 may further comprise one or optical components, e.g. an optical film such as a diffuser film on an external or internal surface of the tube 12 to diffuse the light generated by the SSL elements 30 on the elongate major surface 21 of the flexible carrier strip 20. A portion of the flexible carrier strip 20 is secured to an inner surface portion of the tube 12 such that part of the further elongate surface 22 of the flexible carrier strip 20 is attached to an inner wall section of the tube 12 that axially extends along the tube, i.e. extends in the elongation direction of the tube 12. As previously mentioned, at least the part of the further elongates surface 22 of the flexible carrier strip 20 attached to the inner wall section of the tube 12 carries an electrically insulating film to electrically insulate the flexible carrier strip 20 from the tube 12 such that someone touching the tube of the tubular SSL lighting device 10 whilst the device is connected to a power supply such as a mains power supply is protected from electrical shock.

The rigid PCB 40 may be mounted on an end cap 11 for capping an opening of the tube 12, as is well-known per se. The rigid PCB 40 is typically mounted on the end cap 11 such that upon insertion of the rigid PCB 40 into the tube 12 as indicated by the block arrow, the first major surface 42 of the rigid PCB 40 onto which the driver circuit 50 is mounted faces the elongate major surface 21 of the flexible carrier strip 20. The opposing second major surface 41 of the rigid PCB 40 carries the soldering pads 45 onto which the electrically conductive portions 35 of the flexible carrier strip 20 are soldered as explained in more detail above.

In a preferred embodiment, the flexible carrier strip 20 is secured in the tube 12 as previously explained, e.g. using an adhesive such as glue or a double-sided adhesive tape prior to forming the light engine assembly, i.e. prior to soldering the rigid PCB 40 to the flexible carrier strip 20 as previously explained, such that the elongate major surface 21 faces the elongate or central axis of the tube 12. Typically, the flexible carrier strip 20 may have a length that is greater than the length of the tube 12 such that part of the flexible carrier strip 20 extends beyond the opening of the tube 12, i.e. sticks out of the tube 12, with the terminal regions 25 being external to the tube 12 to provide easy access to the terminal regions and facilitate the soldering of the electrically conductive contacts 35 on the flexible carrier strip 20 to the corresponding soldering pads 45 on the rigid PCB 40.

The portion of the flexible carrier strip 20 extending beyond the opening of the tube 12 typically comprises an intermediate region 23 in between the region of the flexible carrier strip 20 secured to the tube 12, i.e. the region carrying the SSL elements 30 and the terminal regions 25. During insertion of the rigid PCB 40 into the tube 12, the intermediate region 23 is pushed back into the tube 12 such that the intermediate region 23 meanders from the region of the flexible carrier strip 20 carrying the SSL elements 30 to the leading edge 47 of the rigid PCB 40 over which the terminal regions 25 are wrapped, thereby causing part of the flexible carrier strip 20 to fold back on itself. Importantly, because of the leading edge 47 of the rigid PCB 40 forcing the intermediate region 23 of the flexible carrier strip 20 into the tube 12 upon insertion of the rigid PCB 40 into the tube 12, the force on the soldering portions 44 connecting the electrically conductive connections 35 to their corresponding soldering pads 45 is greatly reduced, thereby greatly reducing the risk of failure of these soldering portions 44. Consequently, a tubular solid state lighting device 10 manufactured in accordance with this assembly method is more robust against such assembly failures, without requiring additional cost to achieve this increased robustness.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A tubular solid state lighting device comprising:
  a light transmissive tube comprising an inner wall section axially extending along the tube;
  a flexible carrier strip having a first portion attached to said inner wall section, the flexible carrier strip comprising an elongate major surface and a further elongate major surface opposite the elongate major surface, the elongate major surface carrying a plurality of solid state lighting elements on the first portion, and carrying a plurality of electrically conductive contacts each acting as a terminal for the plurality of solid state lighting elements in adjacent terminal regions at one end of the flexible carrier strip, said adjacent terminal regions being separated by a recess and an enhancing portion bridging parallel edges of the adjacent terminal regions; and
  a rigid printed circuit board comprising:
  a first major surface onto which a driver circuit for the solid state lighting elements is mounted, said first major surface facing the flexible carrier strip;
  a second major surface opposite the first major surface carrying a plurality of spatially separated soldering pads along an edge of the second major surface, each soldering pad corresponding to one electrically conductive contact;
  wherein the further elongate major surface contacts the second major surface such that each electrically conductive contact is aligned with one of the spatially separated soldering pads and is soldered to said soldering pad by a solder portion extending over the terminal region carrying said electrically conductive contact.

2. The tubular solid state lighting device of claim 1, wherein the flexible carrier strip further comprises a meandering intermediate region in between the first portion and the adjacent terminal regions.

3. The tubular solid state lighting device of claim 1, wherein each of the soldering pads is wider than the corresponding electrically conductive contact in a direction along the edge.

4. The tubular solid state lighting device of claim 1, wherein the flexible carrier strip comprises an electrically insulating layer on the further elongate major surface in between the flexible carrier strip and the inner wall section.

5. The tubular solid state lighting device of claim 1, wherein the electrically conductive contacts are copper contacts and/or wherein the solder portion comprises tin.

6. The tubular solid state lighting device of claim 1, wherein the plurality of electrically conductive contacts is a pair of electrically conductive contacts and the plurality of spatially separated soldering pads is a pair of soldering pads.

7. The tubular solid state lighting device of claim 1, further comprising at least one end cap capping the tubular body, said end cap supporting the printed circuit board.

8. The tubular solid state lighting device of claim 1, wherein the solid state lighting elements are LEDs.

9. A method of forming a light engine assembly by soldering a flexible carrier strip to a rigid printed circuit board, comprising:
  providing a flexible carrier strip comprising an elongate major surface and a further elongate major surface opposite the elongate major surface, the elongate major surface carrying a plurality of solid state lighting elements on a first portion of the flexible carrier strip, and carrying a plurality of electrically conductive contacts each acting as a terminal for the plurality of solid state lighting elements in adjacent terminal regions at one end of the flexible carrier strip, said adjacent terminal regions being separated by a recess and an enhancing portion bridging parallel edges of the adjacent terminal regions;
  providing a rigid printed circuit board comprising a first major surface onto which a driver circuit for the solid state lighting elements is mounted and a second major surface opposite the first major surface carrying a plurality of spatially separated soldering pads along an edge of the second major surface, each soldering pad corresponding to one electrically conductive contact;

aligning the flexible carrier strip with the rigid printed circuit board such that the further elongate major surface contacts the second major surface and each electrically conductive contact is aligned with one of the spatially separated soldering pads; and soldering each electrically conductive contact to the aligned soldering pad by applying a solder portion to the electrically conductive contact and extending said solder portion over the terminal region carrying said electrically conductive contact onto the aligned soldering pad.

10. The method of claim 9, wherein each of the soldering pad is wider than the corresponding electrically conductive contacts in a direction along the edge.

11. The method of claim 9, wherein soldering each electrically conductive contact to the aligned soldering pad by applying a solder portion to the electrically conductive contact and extending said solder portion over the terminal region carrying said electrically conductive contact onto the aligned soldering pad is performed with a soldering iron.

12. The method of claim 9, wherein soldering each electrically conductive contact to the aligned soldering pad by applying a solder portion to the electrically conductive contact and extending said solder portion over the terminal region carrying said electrically conductive contact onto the aligned soldering pad comprises applying a solder portion containing tin.

13. An assembling method of a lighting device including a light transmissive tube comprising an inner wall section axially extending along the tube and the light engine assembly formed by the method of claim 10, the assembling method comprising:

securing the first portion of the flexible carrier strip into the tubular body such that the elongate major surface faces a central axis of the tubular body; and inserting the printed circuit board through an opening in said tubular body, thereby causing an intermediate region of the flexible carrier strip in between the first portion and the adjacent terminal regions to meander.

14. The method of claim 13, wherein inserting the printed circuit board through the opening in said tubular body comprises securing the printed circuit board in an end cap for the tubular body and capping said opening with the end cap.

* * * * *